United States Patent
Halberstadt

(10) Patent No.: US 8,542,052 B2
(45) Date of Patent: Sep. 24, 2013

(54) INTEGRATED CIRCUIT CAPACITOR

(75) Inventor: Hans Halberstadt, Groesbeek (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/287,449

(22) Filed: Nov. 2, 2011

(65) Prior Publication Data

US 2012/0105135 A1    May 3, 2012

(30) Foreign Application Priority Data

Nov. 3, 2010   (EP) .................................. 10189867

(51) Int. Cl.
*G06G 7/18*      (2006.01)

(52) U.S. Cl.
USPC ............................ 327/337; 327/345; 331/155

(58) Field of Classification Search
USPC ................. 327/336, 337, 341, 344, 345, 524; 331/155
See application file for complete search history.

(56) References Cited

U.S. PATENT DOCUMENTS

| | | | |
|---|---|---|---|
| 3,667,055 A * | 5/1972 | Uchida ......................... | 327/345 |
| 4,025,867 A | 5/1977 | Seidel | |
| 4,494,551 A * | 1/1985 | Little et al. .................... | 600/509 |
| 4,587,437 A | 5/1986 | Schorr | |
| 4,607,243 A | 8/1986 | Dreier | |
| 5,363,055 A * | 11/1994 | Ribner ............................. | 330/9 |
| 5,539,354 A * | 7/1996 | Carsten ........................ | 327/559 |
| 6,344,772 B1 | 2/2002 | Larsson | |
| 2005/0024150 A1* | 2/2005 | Gordon et al. ................ | 330/307 |
| 2005/0179468 A1* | 8/2005 | Zhou et al. .................... | 326/115 |
| 2010/0253441 A1 | 10/2010 | Huang | |

FOREIGN PATENT DOCUMENTS

WO   2008/132656 A2   11/2008

OTHER PUBLICATIONS

Cuppens, R. et al. "Simulation of Large On-Chip Capacitors and Inductors," J. Solid-State Circuits, vol. 14, No. 3, pp. 543-547 (1979).
Extended European Search Report for European patent appln. No. 10189867.4 (Mar. 14, 2011).

* cited by examiner

*Primary Examiner* — Lincoln Donovan
*Assistant Examiner* — Thomas Skibinski

(57) ABSTRACT

An electrical circuit for emulating a capacitance, comprises a physical capacitor which is charged by charge flow from the input of the electrical circuit. An amplifier amplifies the voltage at the input of the electrical circuit such that the physical capacitor is charged with a larger change in voltage than the change in voltage at the input. This implements an effective multiplication of capacitance. A reset system resets the physical capacitor without drawing charge from the input of the electrical circuit. This extends the voltages which can be provided to the input.

10 Claims, 8 Drawing Sheets

INTEGRATED CIRCUIT CAPACITOR

RELATED PATENT DOCUMENTS

This patent document claims the priority benefit, under 35 U.S.C. §119, of European Patent Application No. 10189867.4, filed on Nov. 3, 2010, and entitled "INTEGRATED CIRCUIT CAPACITOR" and which is fully incorporated herein by reference.

The invention relates to integrated circuit capacitors.

Using integrated circuit technology, often an integrated circuit (i.e. on-chip) capacitor is necessary for various functions, such as holding information, creating timer functions, for use as a component of filter circuits etc.

Due to the limited capacitance per area, the value of an on-chip capacitor is limited to approx 10-100 pF for cost reasons. On-chip capacitors also have leakage currents, but this leakage is very small (in the order of femto amperes) for oxide capacitors. However, when circuitry is connected to the capacitor, such as drain or source connections of a MOS transistor, the leakage current significantly increases due to the pn junctions connected. These leakage currents are temperature dependant and can increase to the pico amperes range or even low into the nano amperes range for very high temperatures above 150° C.

Point defects can increase the leakage current, but even then the leakage levels can be too low to be measured. As an example, a capacitor of 10 pF, with a total leakage current of 50 pA gives a rate of change of voltage dv/dt of 5 Volt per second. This prevents the possibility to make long time constants on-chip using internal capacitors. Of course there are digital solutions such as counters, that are often used to make long times, but in some cases a simple analogue solution saves area and cost, and can give a part that behaves like a physical capacitor.

As physical capacitors cannot generally be tuned in use, it is not possible to adapt component values during operation. This can be desired for example to make filter time constants depend on operating points of the application.

There is therefore a need to address the problem of the practical maximum value of integrated capacitors, and to enable capacitor values to be adapted.

According to the invention, there is provided an electrical circuit for emulating a capacitance, comprising:

a physical capacitor which is charged by charge flow from the input of the electrical circuit;

an amplifier for amplifying the voltage at the input of the electrical circuit such that the physical capacitor is charged with a larger change in voltage than the change in voltage at the input; and a reset system for resetting the state of charge of the physical capacitor without drawing charge from the input of the electrical circuit.

The amplifier performs the function of amplifying the voltage to be applied across the physical capacitor. This voltage amplification is equivalent to an amplification of the capacitance of the circuit, in that for a given charge flow, a large voltage across the physical capacitor is equivalent to a smaller voltage across a larger emulated capacitance.

The reset system enables the charge flow to the circuit input to be used for multiple charges of the physical capacitor. In this way, the voltage to which the emulated capacitor can be charged can be equal to the voltage to which the physical capacitor is charged. Thus, the circuit emulation does not require low voltage operation of the large emulated capacitor.

The invention thus emulates a large capacitor, using a small physical capacitor and additional circuitry. The circuitry implements a first function of multiplying the value of a physical capacitor, by copying the current to the input terminal of the emulated capacitor circuit to the small physical capacitor. The reset system is used as part of a system to increase the voltage window in which the emulated capacitor can operate. The invention enables new circuit solutions than can save area and cost.

In one example, the amplifier comprises:
an amplifying integrator circuit comprising:
an amplifier;
the physical capacitor in a first feedback path directly between the amplifier output and a first input of the amplifier with the input of the electrical circuit provided to the first input of the amplifier; and
a gain element in a second feedback path between the output of the amplifier and a second input of the amplifier, and the reset system comprises:
a control circuit for controlling the second feedback path in dependence on the voltage at the input of the electrical circuit.

In this design, to enable the input voltage to be increased, a feedback path including the gain element is configured adaptively according to the input voltage.

The gain element preferably comprises a voltage amplifier with a gain of less than 1. This means the output voltage of the amplifier is higher than the input voltage, so that a larger voltage is across the physical capacitor.

The control circuit preferably comprises a circuit for controlling a current or voltage provided to the gain element. In this way, the amplifier inputs can be re-calibrated so that the amplifier is arranged to process an input voltage that would otherwise be out of range. The control circuit can thus be considered to change the amplifier bias so that it is matched to the input voltage to the circuit.

The control circuit can comprise:
an up/down counter that counts up when charge flow to/from the input of the electrical circuit causes a first threshold to be reached and counts down when charge flow to/from the input of the electrical circuit causes a second threshold to be reached; and
a D/A converter that converts the output of the up/down counter to an analogue signal,
wherein the analogue signal is applied to an input of the gain element.

This arrangement provides an incremental change to the second feedback path, which is equivalent to an incremental change to the bias conditions of the amplifier, each time the input voltage exceeds (above or below) a threshold.

The D/A converter has a voltage output or a current output, and the gain element is designed accordingly.

The physical capacitor can have a programmable value of capacitance and/or the gain element can have a programmable gain value. These measures enable the multiplication factor between the physical capacitor value and the emulated capacitance to be tuneable.

The circuit can have first and second inputs between which a floating capacitor is defined. The input current to one of the inputs can be copied to the other input.

The invention also provides an integrated circuit including a capacitor emulating circuit of the invention.

The invention also provides a method of emulating a capacitance using an electrical circuit, comprising:
charging a physical capacitor by charge flow from the input of the electrical circuit;

amplifying the voltage at the input of the electrical circuit such that the physical capacitor is charged with a larger change in voltage than the change in voltage at the input, and resetting state of charge of the physical capacitor without drawing charge from the input of the electrical circuit in response to the voltage at the input of the electrical circuit reaching a threshold.

Examples of the invention will now be described in detail with reference to the accompanying drawings, in which.

The invention provides an electrical circuit for emulating a capacitance, in which a physical capacitor and an amplifying integrator circuit are used to provide an effective multiplication of the physical capacitance. This capacitance multiplication can be considered a first main feature. A reset system is controlled in dependence on the voltage at the input of the electrical circuit, so that the range of input voltages is extended. This can be considered as a second main feature.

Figure 1:
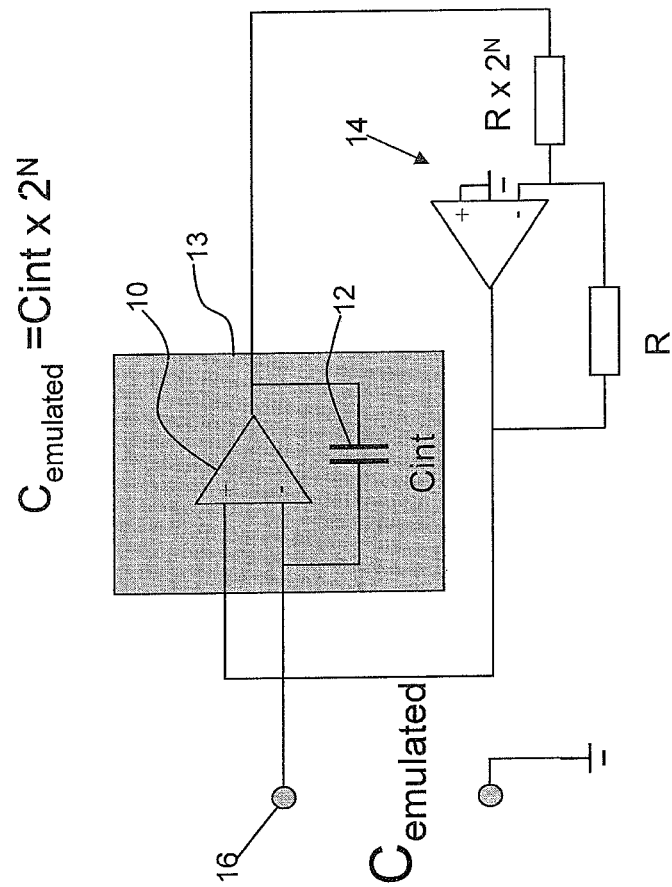
FIG. 1 is a basic high level block diagram explaining the circuit components for implementing a first concept underlying the invention.

FIG. 1 is a basic high level block diagram explaining the circuit components for implementing the first feature mentioned above.

The circuit comprises an amplifier 10 with a physical capacitor 12 (also labelled Cint) in a first feedback path directly to the inverting input. This implements an integrator 13. A second feedback path to the non-inverting input includes a gain element 14. The gain element has a gain of less than 1, so that the non inverting input of the amplifier receives a scaled down version of the output. In the example shown, the gain is $\frac{1}{2}^N$, and this gives the result that the output of the amplifier 10 is scaled up version of the input voltage. Thus, the voltage across the physical capacitor is a scaled up version of the voltage at the circuit input 16.

The input current from the input terminal 16 of the emulated capacitor is sensed by the integrator. The sensed current is copied to the small physical capacitor 12 automatically. The gain element 14 is in the form of a voltage amplifier, based on a basic opamp with a resistive divider as feedback giving an voltage gain of:

$$\text{Gain} = -R/(R \times 2^N) = -\frac{1}{2}^N.$$

The input is at voltage Vin and the output is at $-2^N$ Vin, so the voltage across the physical capacitor is $(2^N+1)$Vin.

This effectively gives a reduction of a factor $2^N+1$ at the input terminal for the same amount of charge at the input node. This effectively increases the value of Cint by a factor $2^N+1$.

The components of FIG. 1 implement an amplifying integrator circuit.

There is a reduction of the maximum voltage at the input by a factor $2^N+1$, because the capacitor 12 (Cint) is still charged with the same charge from the input and therefore Cint is charged to the same maximum voltage.

The second main feature outlined above provides a reduction in the maximum voltage across Cint when it reaches this maximum threshold, in a way that enables the voltage at the input to the emulator circuit to continue to rise.

The idea is to discharge Cint so that an increased in voltage at the input can be tolerated. However, the effect of discharging Cint on the input has to be compensated.

Discharging the capacitor Cint with a voltage deltaV will result in a change in voltage deltaV at the input of the amplifier and a change in voltage deltaV×(1/[$2^N$+1]) at the output of the amplifier and therefore at the input of the emulated capacitor.

Thus, by controlling the discharge of the capacitor Cint, changes in the voltage at the input 16 can be compensated. This idea is used in the embodiment of FIG. 2 which shows a high level block diagram.

The voltage at the input 16 is compared with a maximum and a minimum by comparators 20,22, generating an up count pulse 21 or a down count pulse 23 respectively.

When current flows to the input 16 (which is representative of charging the virtual capacitor), the voltage at the output of the amplifying integrator 13 drops due to the connection of the input to the inverting terminal. When the output of the integrating amplifier 13 reaches the low threshold, i.e. comparator 22 detects that the output voltage of the integrating amplifier is Vmin below the voltage at the input 16, a down count pulse 23 is generated. This lowers the output of the D/A converter 28.

Similarly, an increasing count pulse 21 is generated if the voltage at the output of the integrator is greater than the voltage at the input 16 by more than the Vmax value, which means the circuit is attempting to charge the physical capacitor beyond Vmax. This corresponds to discharging of the emulated capacitor, again as a result of the inverting configuration of the gain element 14. The values Vmin and Vmax in FIG. 2 can be equal.

The first count pulse, starting with an empty emulated capacitor, starts from an analogue output AD=0, i.e. 0 V at the output of the gain element 14 and no current to the input of the gain element.

Figure 2:
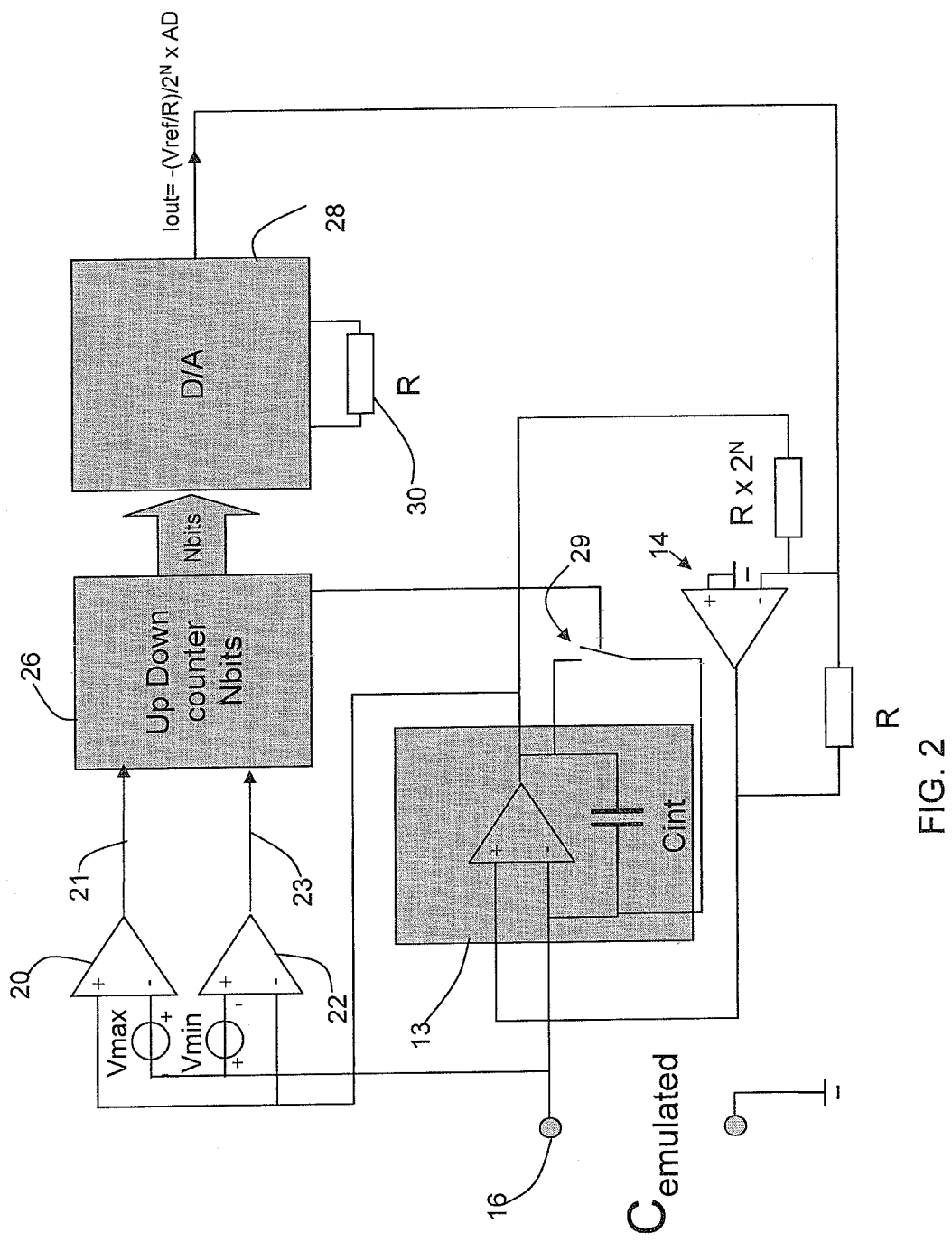
FIG. 2 shows a first example of circuit of the invention.

As shown in FIG. 2, the voltage at input 16 has the Vmin and Vmax steps applied before comparison with the output of the integrator 13. This implements the function explained above.

The count pulses are fed to a counter 26 which generates an N bit counter output. When an up or down count pulse is given, the integrator capacitor is completely discharged and the effect of that (a voltage step of Vmax/[$2^N$+1] at the emulated capacitor input 16 up or down) is compensated by the same amount as follows: As outlined above, a count down pulse causes the output current Iout of the D/A converter to fall, causing the output of amplifier 14 to rise. This compensates for a falling voltage which would otherwise take place at node 16 in response to resetting the capacitor Cint (by means of a reset switch 29 across the capacitor). Similarly, an up count pulse causes the output current Iout of the D/A converter to rise, causing the output of amplifier 14 to fall. This compensates for a rising voltage which would otherwise arise at the input 16 in response to the capacitor reset.

The reset is effected by closing the reset switch 29 across the capacitor. The compensation involves the conversion of the count value by a D/A converter 28. The output of the D/A converter 28 increases with 1 LSB, and this is equivalent to a current of Vref/(R×$2^N$). Thus the D/A converter has a current output, and a voltage conversion resistor 30 is part of the D/A converter design.

The reference voltage Vref is designed to create a step at the non inverting input of the amplifier 10 so that the voltage at the input 16 can seamlessly continue to rise, charging the capacitor Cint back from its discharged state.

The current output of the D/A converter 28 is added to the virtual ground of the opamp of the gain element 14, giving a voltage rise of Vref/($2^N$) at the non inverting input of the integrator 10, and therefore also at the inverting input of the integrator that is the emulated capacitor input 16.

In this way, the total effect is no change of voltage at the input of the emulated capacitor when Vref is chosen equal to Vmax, but with the possibility to charge Cint again to the Vmax level.

The same iterative process can be applied to the Vmin level that is equal to Vmax and results in counting down.

In this case, the reset operation operates when the voltage across the capacitor is in the opposite sense. Thus, the same reset operation allows continued decrease in voltage at the input 16. The reset operation thus takes place in response to both an up count pulse and a down count pulse.

The effective voltage window is increased by a the same factor $2^N$.

Essentially, the emulated capacitor circuit drains/supplies charge from/to the input 16 and uses this to charge/discharge a smaller physical capacitor to a larger voltage. Because there is a limit to the voltage to which the small physical capacitor can be charged, the physical capacitor is discharged when the limit is reached, so that it can continue to receive/provide charge from/to the input 16. The charge able to flow to the input 16 and the corresponding change in voltage is thus commensurate with the large desired emulated capacitance.

Figure 3:
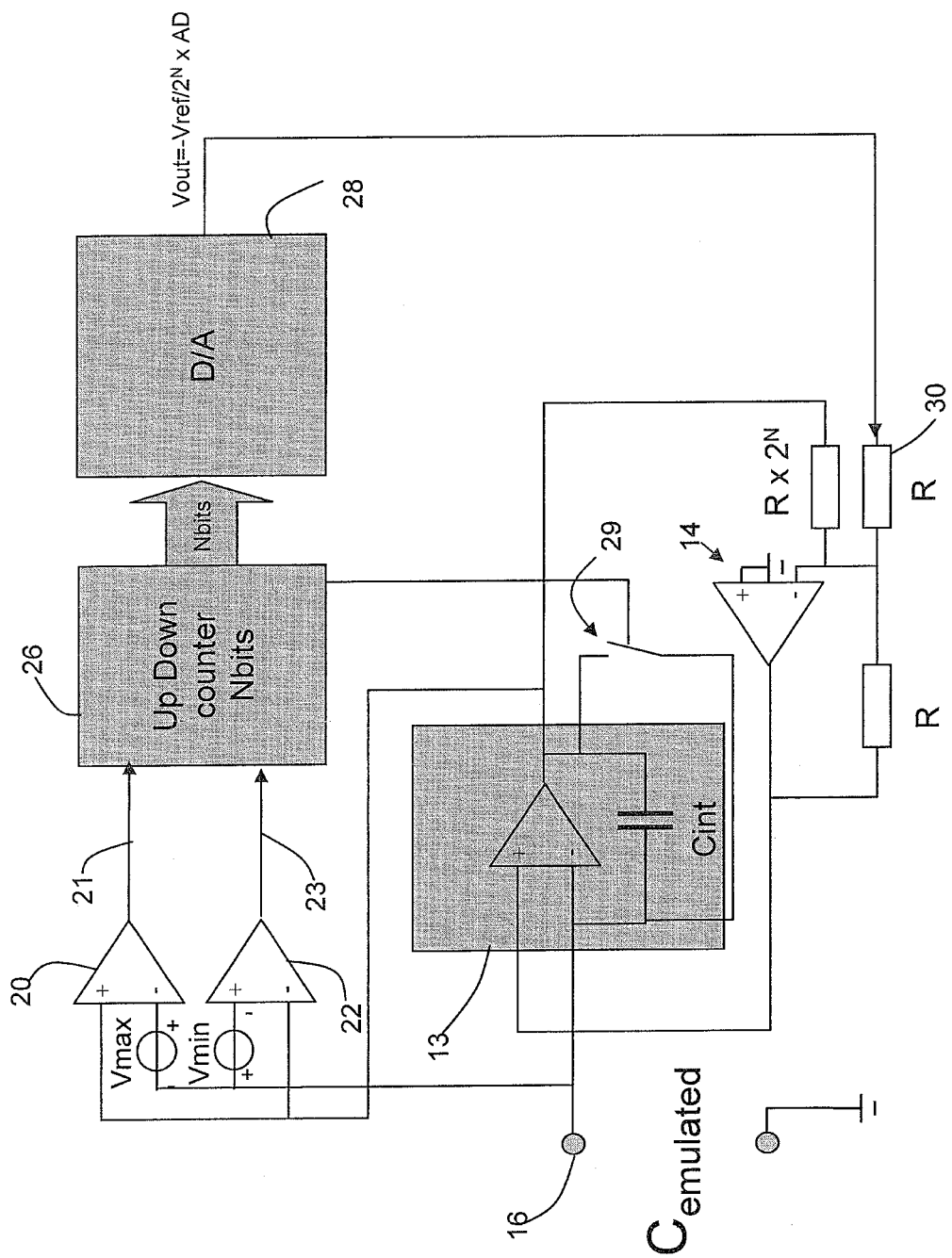
FIG. 3 shows a second example of circuit of the invention.

FIG. 3 shows a modification to the version of FIG. 2 in which the D/A converter 28 has a voltage output. Compared to FIG. 2, the conversion resistor 30 is shifted from the DA converter to the gain element 14.

In FIG. 3, the voltage output of the A/D converter 28 is provided to the inverting input of the gain element 14. The output of the D/A converter 28 can instead be inverted, and fed it to the positive input of the gain element 14. The integrator 13 could also be realized by a non-inverting structure. In this case, the gain element 14 should also be non-inverting and the output of the D/A converter will have a positive sign.

Using the approach of the invention, it is possible to adapt the value of the emulated capacitor in several ways during operation.

One possibility is to switch capacitors in parallel with the physical capacitor 12 (Cint), if necessary pre-biased with a copy of the voltage across the capacitor to prevent jumps in voltage, when connecting. In this way, small steps in capacitor value can be realized.

Another possibility is to adapt the factor N which determines the multiplication factor $2^N$. This can be done in integer steps. It is again possible to prevent sudden jumps in emulated capacitor voltage by adapting the counter value, for example by shifting the complete counter value 1 bit to the left or right, if the multiplication factor has changed by factor of 2.

Figure 4:
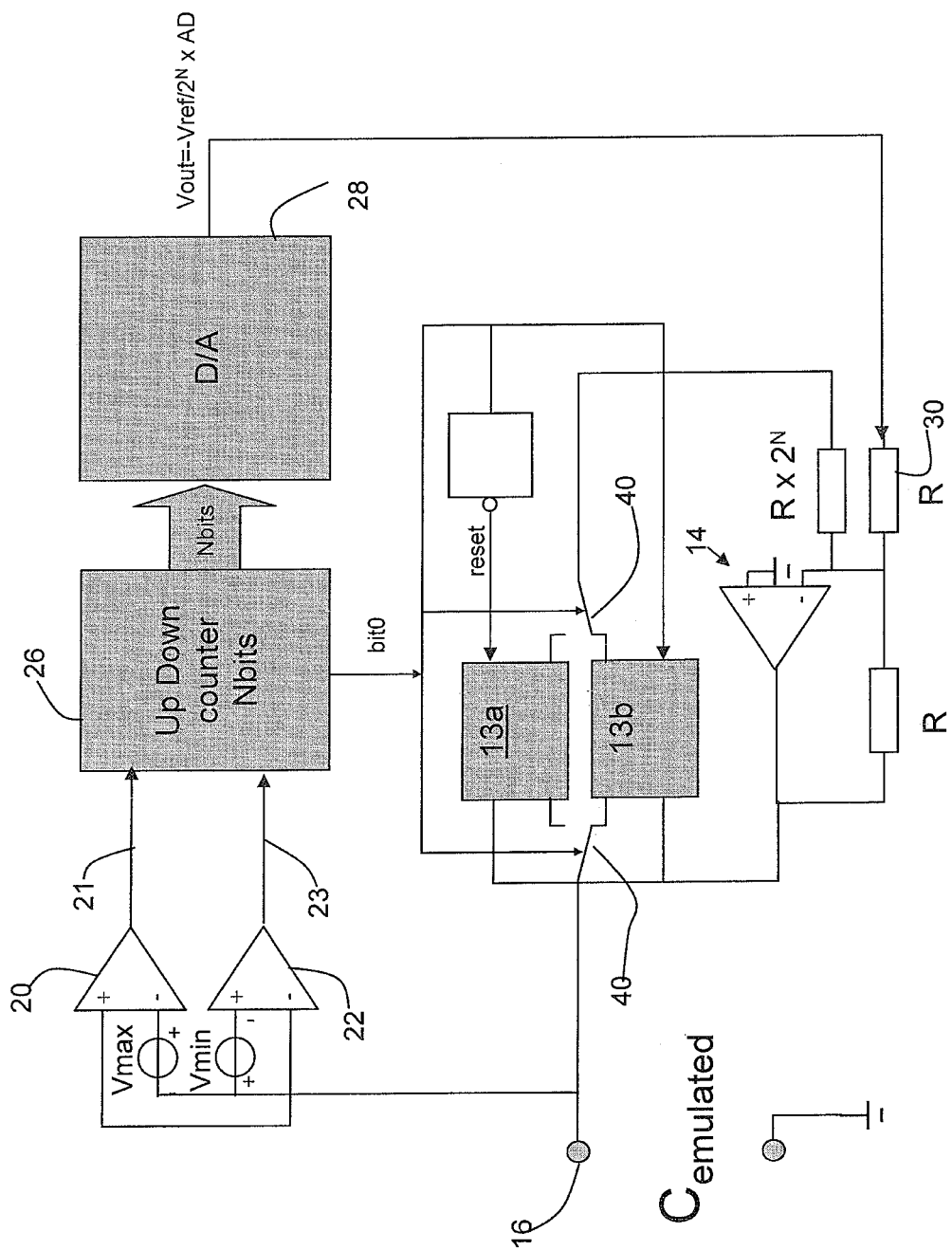
FIG. 4 shows a third example of circuit of the invention.

FIG. 4 shows an embodiment using a double integrator. The double integrator comprises two integrator circuits 13a, 13b, each of which comprises an amplifier and its own feedback capacitor. One integrator is discharged while the other one is integrating. As shown in FIG. 4, a switch arrangement 40 controls which integrator is connected to the input 16 and gain element 14, and this is under the control of the LSB of the counter. Thus, at each counter change, the integrators switch roles. The integrators 13a,13b have complementary reset commands.

This arrangement avoids the need to reset the integrator fast, which is otherwise needed to prevent a mismatch between the integrator output and the D/A output, causing voltage spikes at the emulated capacitor. In the design of FIG. 4, the discharge interval can be made longer, simplifying the circuit design. Thus, the double integrator prevents spikes due to the finite discharge speed of the integrator during the reset intervals.

The embodiments above show a capacitor with one side grounded, and the input 16 is formed by the floating side of the capacitor.

The invention can also be used for a circuit in which the emulated capacitor needs both sides floating.

Figure 5:
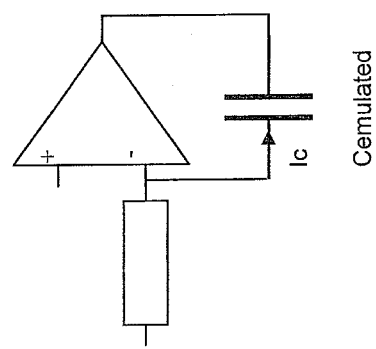
FIG. 5 shows an integrator application which requires a floating capacitor.

Depending on the application, it can be necessary to have the voltage current relation available for one (floating) terminal of the capacitor or for both floating terminals. For example, in an integrator application as shown in FIG. 5 with the emulated capacitor in a feedback path from the output of an opamp to the inverting input, it is not desired to have a current provided to the terminal that is connected to the output of the opamp, but it is required to have both nodes floating. Thus, the current is required in one terminal only of the emulated capacitor.

In this case, the design of FIG. 2 (or FIG. 3) can be adapted to enable the lower node to float, but without the capacitive current flowing to that node. This design is shown in FIG. 6.

Figure 6:
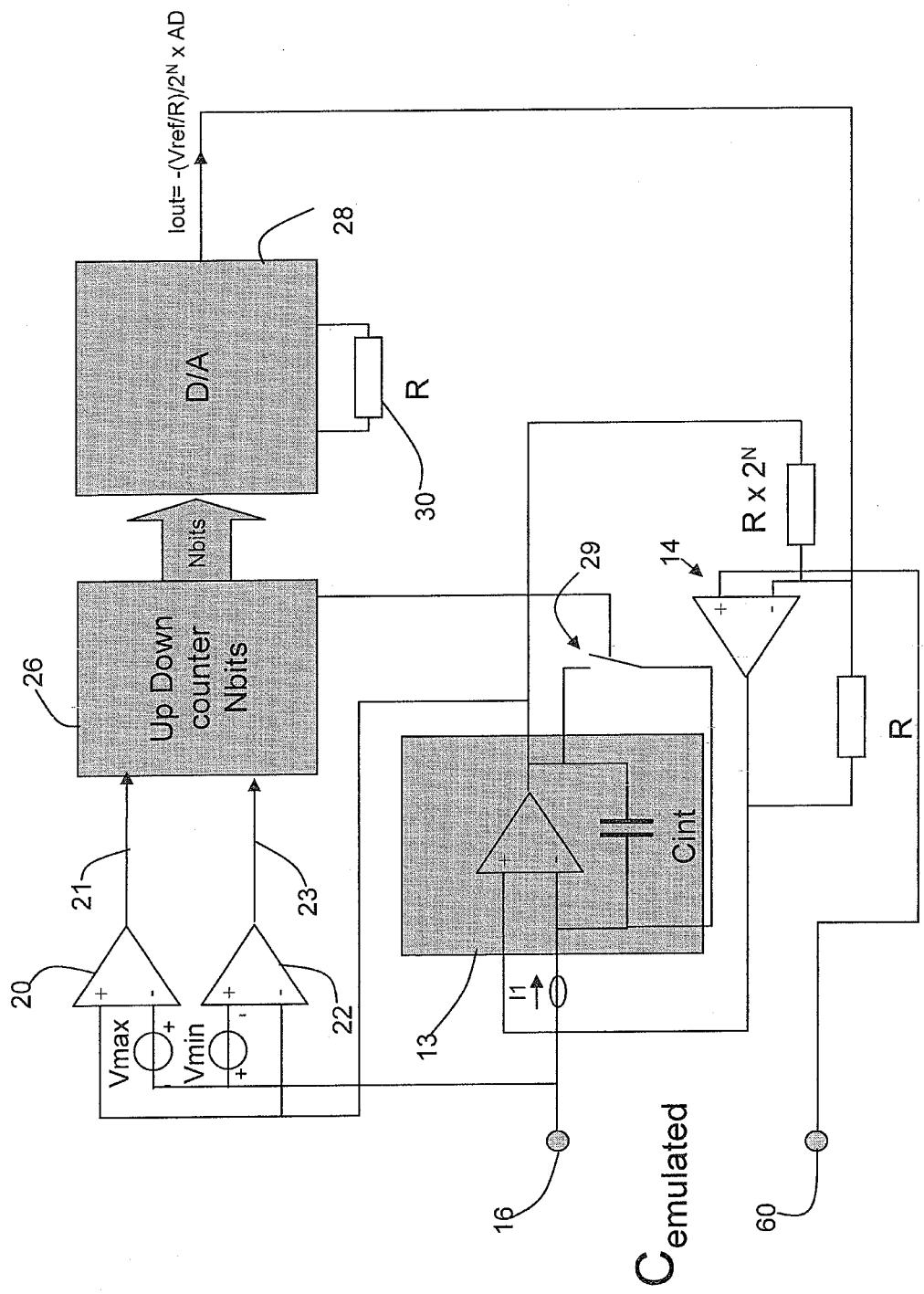
FIG. 6 shows a fourth example of circuit of the invention for a floating capacitor.

FIG. 6 differs from FIG. 2 only in that the non-inverting input of the amplifier of the gain element 14 is connected to the lower floating capacitor terminal 60.

The lower terminal 60 can then be connected to voltages different from ground, while maintaining the voltage relation with the upper terminal.

For the upper node, the relation between voltage and current is:

$$I1 = C_{emulated} \times dv/dt \text{ where } v \text{ is the voltage difference between the floating terminals.}$$

Figure 7:
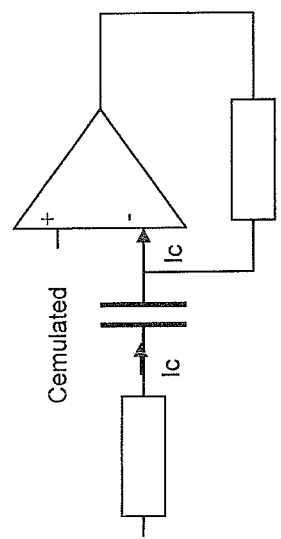
FIG. 7 shows an inverting differentiator application which requires a floating capacitor.

An example where the current in both terminals is necessary is shown in FIG. 7, in which the capacitor is connected in series to the inverting input of an opamp to form an inverting differentiator.

In this case, the floating capacitor needs additional current to be added in the lower terminal equal to the current in the upper terminal, but with opposite sign. An embodiment of such a floating capacitor is given in FIG. 8.

Figure 8:
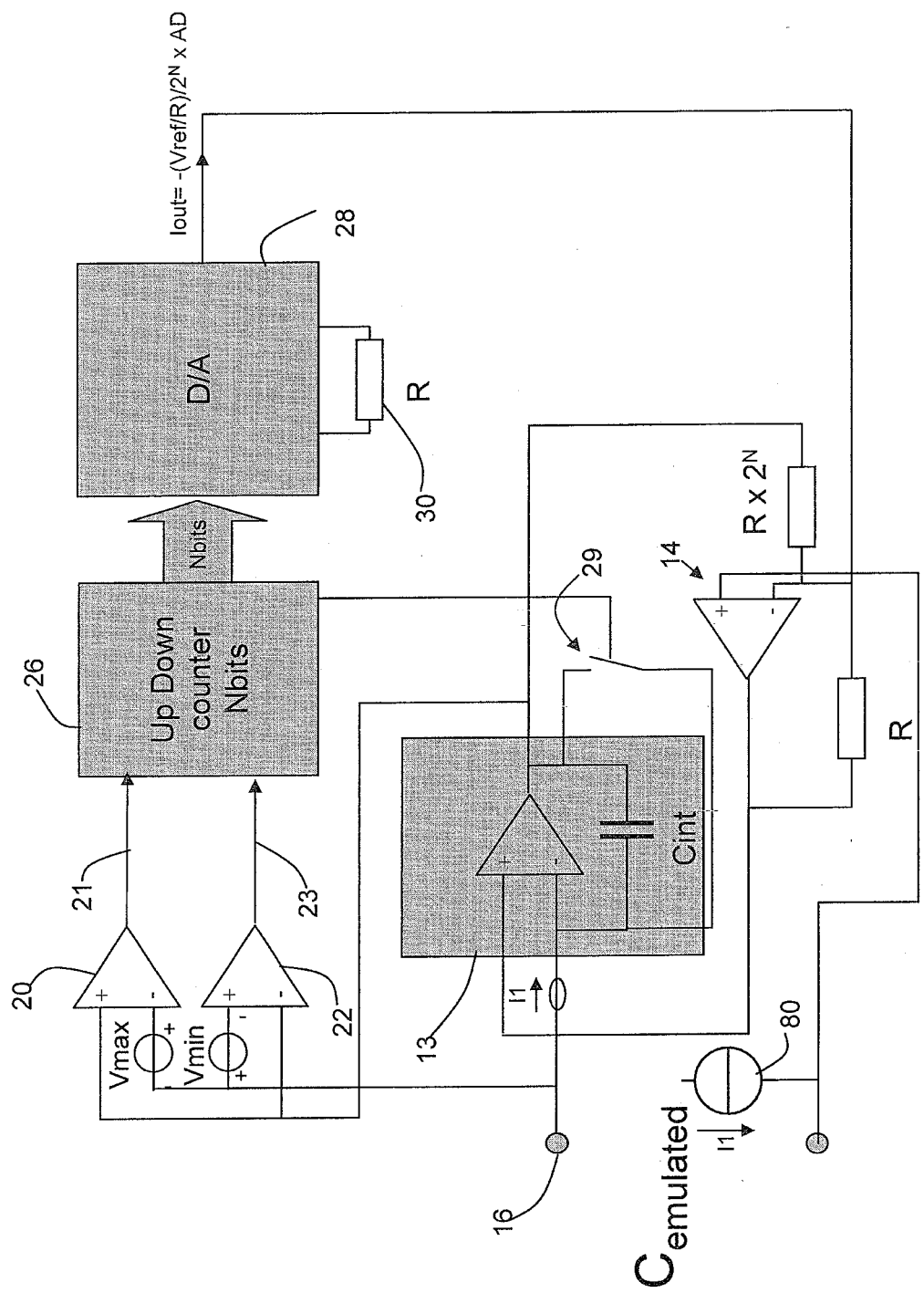
FIG. 8 shows a fifth example of circuit of the invention for a floating capacitor in conceptual form.

FIG. 8 differs from FIG. 6 only in that a copy of the current flowing to the top input 16 is copied to the lower terminal 60, as represented by the current source 80.

Figure 9:
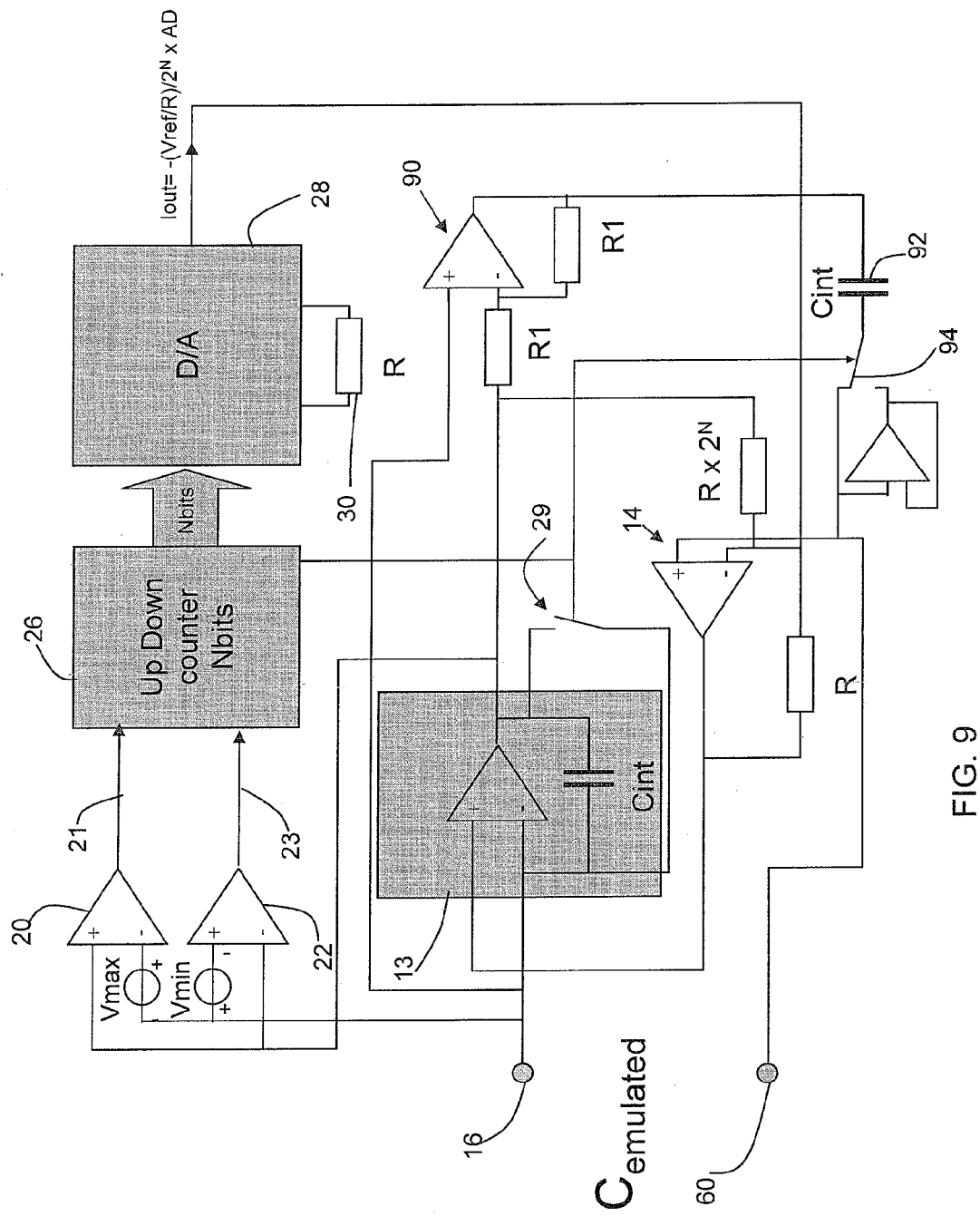
FIG. 9 shows an implementation of the circuit of FIG. 8.

A practical implementation of this concept is given in FIG. 9.

The current I1 flowing to the input is generated by copying the voltage across the capacitor Cint by a second unity gain amplifier 90. By connecting the output of this second amplifier 90 with a second capacitor Cint 92 to the lower terminal 60, a copy of the current in the upper terminal is made, but with opposite sign as desired.

During the reset process, when the integrator capacitor is discharged, it is required to interrupt the connection between the additional capacitor 92 and the lower terminal 60, as only the current resulting from the charging/discharging process of Cint should flow to the lower terminal. Thus, the reset command also controls a switch 94 which allows the current flow or prevents it (by coupling the capacitor 92 to the output of an amplifier which provides a buffered version of the voltage of the lower terminal 60 during the reset period).

The invention can be applied in on-chip application where a large capacitor is needed.

The basic circuit design in the various examples above is the same. However, the invention can be implemented in different ways. The essential concept is that for an emulated capacitor, a change in voltage at the input of the circuit is used to derive a charge flow which is consistent with an emulated capacitance. This charge flow is provided to a real capacitor which is smaller than the emulated capacitance, which results in larger voltage change than is arising at the input of the circuit. The small capacitor is charged repeatedly so that it can sink the required current that corresponds to a larger capacitance. Thus, the invention basically requires a charging circuit for the smaller real capacitor which is provided with charge from the input of the emulated capacitor circuit. In addition, a way of resetting the real capacitor is required and which does not use charge flow to or from the input of the emulated capacitor circuit.

Examples of other circuit that can be used, instead of the amplifying integrator, are
- a compensation network for the regulation loop, with feedback for example as used in the feedback path of a switch mode power supply, allowing the external components to be replaced by internal components, and also allowing the compensation network to be trimmed electronically.
- analogue timers with large time constants.
- sample and hold circuits with long holding times
- other analogue circuits that need to hold information during long time intervals, for example a loop that generates a signal locked to the phase angle of the mains voltage.

The invention can use on-chip capacitors for example of 10 pF-100 pF to generate emulated capacitances in the low nF range. Thus, the multiplier $2^N+1$ can be of the order of hundreds or thousands. For example, a 10 pF real capacitor can be multiplied by 257 ($2^8+1$) to generate an emulated capacitance of 2.57 nF.

The greater the value of $2^N+1$, the more resetting operations are needed if there is a full voltage swing across the emulated capacitor. Thus, the emulated capacitor will be designed for particular applications, depending on the expected charge and voltage fluctuations, as well the required charge flow rate (current) since this will determine the speed with which the reset operations must be effected.

The effect of a leakage current in the physical capacitor (in the amplifier feedback path) is reduced by the feedback path. Approximating the capacitance gain as $2^N$, the effect of leakage current is reduced by the ratio $½^N$. Thus, the circuit design has good tolerance of leakage currents in the physical on-chip capacitor. What is important for a capacitor with respect to leakage is how fast the voltage drops due to leakage, i.e. dV/dt. As dV/dt=Ileakage/Cint for a simple capacitor, in order to improve the leakage behaviour, the ratio Ileakage/Cint should be reduced.

With reference to FIG. 1, the physical capacitor is Cint with leakage current Ileakage.

Cint is increased by the factor $2^N$ because a charge Q brought at the input terminal will cause a voltage change deltaV=Q/Cint across Cint. However, as this voltage is divided by $2^N$ and then fed back to the positive input of the amplifier, giving the same voltage at the inverting input, the actual change in voltage at the input terminals is deltaV/$2^N$. To compensate for the leakage current, it is still only necessary to put the original leakage current Ileakage into the upper terminal to keep the voltage across Cint constant. This finally means that the ratio Ileakage/Clarge is $½^N$ of the original ratio, effectively reducing the leakage current compared with the prior art solution with a factor $2^N$.

As mentioned above, the physical capacitor can have a programmable value of capacitance and/or the gain element can have a programmable gain value. If the gain element has a programmable value, the number of bits of the D/A converter should be adapted accordingly. During programming it is possible to prevent sudden jumps at the emulated capacitor voltage by adapting the AD value accordingly.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An electrical circuit for emulating a capacitance, comprising;
   a physical capacitor which is charged by charge flow from an input of the electrical circuit;
   an amplifier for amplifying the voltage at the input of the electrical circuit such that the physical capacitor is charged with a larger change in voltage than a change in voltage at the input; and
   a reset system for resetting a state of charge of the physical capacitor without drawing charge from the input of the electrical circuit;
   wherein the amplifier and the physical capacitor form an amplifying integrator circuit,
   wherein the physical capacitor is in a first feedback path between an output of the amplifier and a first input of the amplifier with the input of the electrical circuit provided to the first input of the amplifier,
   wherein the electrical circuit further comprises a gain element in a second feedback path between the output of the amplifier and a second input of the amplifier,
   and wherein the reset system comprises:
   a control circuit for controlling the second feedback path in dependence on a voltage at the input of the electrical circuit, wherein the control circuit comprises a circuit for controlling one of a current and a voltage provided to the gain element;
   an up/down counter that counts up when the voltage at the output of the amplifier reaches a first level compared to the input and counts down when the voltage at the output of the amplifier reaches a second level compared to the input; and
   a D/A converter that converts the output of the up/down counter to an analogue signal,
   wherein the analogue signal is applied to an input of the gain element.

2. A circuit as claimed in claim 1, wherein the D/A converter has a voltage output.

3. A circuit as claimed in claim 1, wherein the D/A converter has a current output.

4. A circuit as claimed in claim 1, wherein the physical capacitor has a programmable value of capacitance.

5. A circuit as claimed in claim 1, wherein the gain element has a programmable gain value.

6. A circuit as claimed in claim 1, wherein the circuit has first and second inputs between which a floating capacitor is defined.

7. A circuit according to claim 6, where the input current to one of the inputs is copied to the other input.

8. An integrated circuit including a circuit according to claim 1.

9. A method of emulating a capacitance using an electrical circuit, comprising:
- charging a physical capacitor by a charge flow from an input of the electrical circuit;
- amplifying a voltage at the input of the electrical circuit such that the physical capacitor is changed with a larger change in voltage than a change in voltage at the input;
- resetting a state of charge of the physical capacitor without drawing charge from the input of the electrical circuit in response to the voltage at the input of the electrical circuit reaching a threshold;
- integrating and amplifying the charge flow to the physical capacitor by connecting the physical capacitor in a first feedback path directly between an amplifier output and a first input of the amplifier to which the input of the electrical circuit is connected, and
- the resetting comprises:
  - controlling a second feedback path between the amplifier output and a second input of the amplifier, which second feedback path includes a gain element, the configuration being in dependence on a voltage at the input of the electrical circuit; and
  - wherein controlling the second feedback path comprises:
    - counting up at an up/down counter when the voltage at the output of the amplifier reaches a first level compared to the input and counting down at the up/down counter when the voltage at the output of the amplifier reaches a second level compared to the input; and
    - converting the output of the up/down counter to an analogue signal, wherein the analogue signal is applied to an input of the gain element.

10. The circuit of claim 1, wherein the reset system comprises a control circuit for controlling, a feedback path having a gain element between an output of the amplifier and an input of the amplifier, in dependence on a voltage at the input of the electrical circuit, wherein the control circuit comprises:
- a circuit for controlling one of a current and a voltage provided to the gain element;
- an up/down counter that counts up when the voltage at the output of the amplifier reaches a first level compared to the input and counts down when the voltage at the output of the amplifier reaches a second level compared to the input; and
- a D/A converter that converts the output of the up/down counter to an analogue signal,
wherein the analogue signal is applied to an input of the gain element.

* * * * *